United States Patent
Popescu et al.

(10) Patent No.: US 8,232,784 B2
(45) Date of Patent: Jul. 31, 2012

(54) CIRCUITS AND METHODS FOR CURRENT SENSING

(75) Inventors: Serban Mihai Popescu, San Carlos, CA (US); Cristian Andreev, San Jose, CA (US)

(73) Assignee: O2Micro, Inc, Santa Clara, CA (US)

( * ) Notice: Subject to any disclaimer, the term of this patent is extended or adjusted under 35 U.S.C. 154(b) by 641 days.

(21) Appl. No.: 12/406,269

(22) Filed: Mar. 18, 2009

(65) Prior Publication Data

US 2010/0066321 A1   Mar. 18, 2010

Related U.S. Application Data

(60) Provisional application No. 61/072,617, filed on Apr. 1, 2008.

(51) Int. Cl.
*G05F 1/40* (2006.01)
*G05F 1/569* (2006.01)

(52) U.S. Cl. ........................ 323/280; 323/276

(58) Field of Classification Search .......... 323/273–277, 323/280
See application file for complete search history.

(56) References Cited

U.S. PATENT DOCUMENTS

| | | | | |
|---|---|---|---|---|
| 5,422,593 A | * | 6/1995 | Fujihira | 327/561 |
| 5,847,554 A | * | 12/1998 | Wilcox et al. | 323/282 |
| 7,031,855 B2 | * | 4/2006 | Mottola | 702/64 |
| 2006/0028188 A1 | * | 2/2006 | Hartular et al. | 323/273 |

* cited by examiner

*Primary Examiner* — Jessica Han

(57) ABSTRACT

A current sensing circuit includes a first resistor, a second resistor and a sense amplifier. The first resistor converts a current flowing through the first resistor to a voltage drop between positive and negative sides of the first resistor. The second resistor is coupled to the negative side of the first resistor. The sense amplifier is coupled to the positive side of the first resistor via a first pin of the sense amplifier, and coupled to the negative side of the first resistor through the second resistor via a second pin of the sense amplifier. The sense amplifier employs a negative feedback to generate a sensing current proportional to the current flowing through the first resistor.

16 Claims, 5 Drawing Sheets

CIRCUITS AND METHODS FOR CURRENT SENSING

RELATED APPLICATION

This application claims priority to U.S. Provisional Application No. 61/072,617, filed on Apr. 1, 2008, which is hereby incorporated by reference in its entirety.

BACKGROUND

Current sensing circuits are included in electric circuits for detecting current conditions. For example, current sensing circuits implemented in DC/DC converters sense a load current such that the load current can be controlled. Generally, DC/DC converters utilize an internal resistive element (e.g., an internal resistor or inductor direct current resistance (DCR)) to sense the load current. However, this approach may be inadequate for highly accurate applications since the internal resistive element is process-dependent and meanwhile suffers from a thermal coefficient different with discrete resistive elements in external circuits. In other circumstances, regular voltage amplifiers are utilized in current sensing circuits to enlarge the voltage of the internal resistive element and convert the enlarged voltage into a current for subsequent signal processing. However, regular voltage amplifiers tend to impose stability concerns on current sensing.

SUMMARY

In one embodiment, a current sensing circuit includes a first resistor, a second resistor and a sense amplifier. The first resistor converts a current flowing through the first resistor to a voltage drop between positive and negative sides of the first resistor. The second resistor is coupled to the negative side of the first resistor. The sense amplifier is coupled to the positive side of the first resistor via a first pin of the sense amplifier, and coupled to the negative side of the first resistor through the second resistor via a second pin of the sense amplifier. The sense amplifier employs a negative feedback to generate a sensing current proportional to the current flowing through the first resistor.

BRIEF DESCRIPTION OF THE DRAWINGS

Advantages of the present invention will be apparent from the following detailed description of exemplary embodiments thereof, which description should be considered in conjunction with the accompanying drawings, in which.

DETAILED DESCRIPTION

Reference will now be made in detail to embodiments of the present invention. While the invention will be described in conjunction with the embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
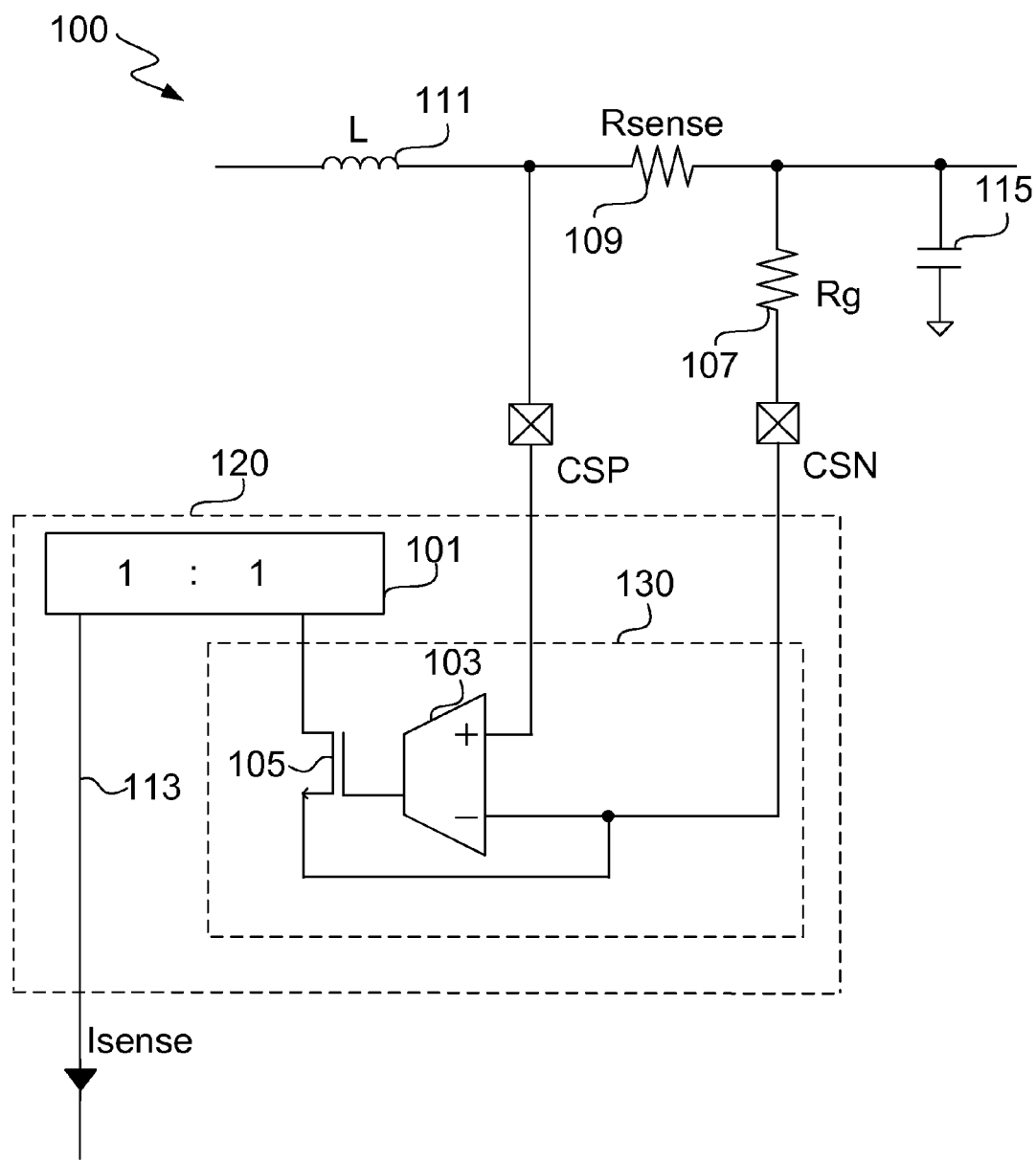
FIG. 1 is a schematic diagram of a current sensing circuit according to one embodiment of the present invention.

FIG. 1 illustrates a schematic diagram of a current sensing circuit 100 according to one embodiment of the present invention. The current sensing circuit 100 includes a current mirror 101, an amplifier 103, a transistor 105, an external resistor 107, and a sense resistor 109, in one embodiment. The current sensing circuit 100 is used to sense the current flowing through an electronic component. For example, the electronic component can be an inductor 111 in a DC/DC converter.

To sense the inductor current, the sense resistor 109 is coupled in series with the inductor 111 at the left side of a capacitor 115. As the inductor current flows through the sense resistor 109, a sensing voltage Vsense equal to $I_L$*Rsense is produced across the sense resistor 109, where $I_L$ is the inductor current and Rsense is the resistance of the sense resistor 109. In other words, a voltage drop Vsense equal to $I_L$*Rsense is produced between positive and negative sides of the sense resistor 109. Furthermore, the positive side of the sense resistor 109 is coupled to the non-inverting terminal of the amplifier 103, in one embodiment. The negative side of the sense resistor 109 is coupled to the inverting terminal of the amplifier 103 through the external resistor 107, in one embodiment.

The output terminal of the amplifier 103 is coupled to the gate of the transistor 105. The drain of the transistor 105 is coupled to the current mirror 101, and the source of the transistor 105 is coupled to the inverting terminal of the amplifier 103. As such, the transistor 105 is used as a negative feedback circuit for the amplifier 103, and the amplifier 103 and the transistor 105 constitute a voltage follower 130. In other words, the voltage at the inverting terminal of the amplifier 103 is forced to be equal to the voltage at the non-inverting terminal of the amplifier 103 by the negative feedback circuit. As such, the voltage drop applied on the external resistor 107 is also substantially equal to Vsense. Therefore, a current substantially equal to Vsense/Rg is formed to flow from the negative feedback circuit to the external resistor 107, where Rg is the resistance of the external resistor 107. As such, the current flowing through the transistor 105 is also substantially equal to Vsense/Rg. The current flowing through the transistor 105 is further duplicated by the current mirror 101 and output on an output line 113 as a sensing current Isense, in one embodiment. Accordingly, the sensing current Isense can be given by $$Isense = Vsense/Rg = I_L \times Rsense/Rg. \qquad (1)$$

In the example of FIG. 1, the sense resistor 109 is coupled between the inductor 111 and the capacitor 115. Alternatively, the sense resistor 109 can be coupled in series with the inductor 111 at the right side of the capacitor 115. In this instance, a load current $I_{load}$, e.g., which represents a current flowing through a load of the DC/DC converter is equal to the inductor current $I_L$ plus Isense. Given by Rsense/Rg>>1, practical implementation of Isense can be negligible. Thus, $I_{load}$ is approximately equal to $I_L$. Accordingly, the sensing current Isense can be given by $$Isense = Vsense/Rg = I_{load} \times Rsense/Rg. \qquad (2)$$

In practical implementation, the current mirror 101, the amplifier 103 and the transistor 105 can be integrated together as a sense amplifier 120. The sense amplifier 120 can interface with the external resistor 107 and the sense resistor 109 respectively via a CSP pin and a CSN pin. In other words, the voltage follower 130, which includes the amplifier 103 and the transistor 105, is coupled to the CSP in and the CSN in via the non-inverting and inverting terminals of the voltage follower 130 (i.e., the non-inverting and inverting terminals of the amplifier 103) respectively, as shown in FIG. 1. As such, a gain of the sense amplifier 120 can be determined by external components (the external resistor 107 and the sense resistor 109). Due to the configurability and stability of the external resistor 107 and the sense resistor 109, the gain of the sense amplifier 120 is user adjustable and relatively time stable, in one embodiment. In one embodiment, because both the external resistor 107 and the sense resistor 109 are placed externally, accuracy issue caused by the different thermal coefficient of internal resistive elements can be resolved. In one embodiment, the external resistor 107 and/or the sense resistor 109 can be temperature-dependent (thermistors) such that the thermal drift of current sensing element (Inductor DCR sensing) within the DC/DC converter can be compensated to maintain the stability of the sensing current Isense.

Advantageously, besides the sensing current Isense on the output line 113, additional sensing current outputs can be obtained from the current mirror 101. These sensing current outputs can be used in a variety of applications, such as over current protection, load line control and current monitor.

Figure 2:
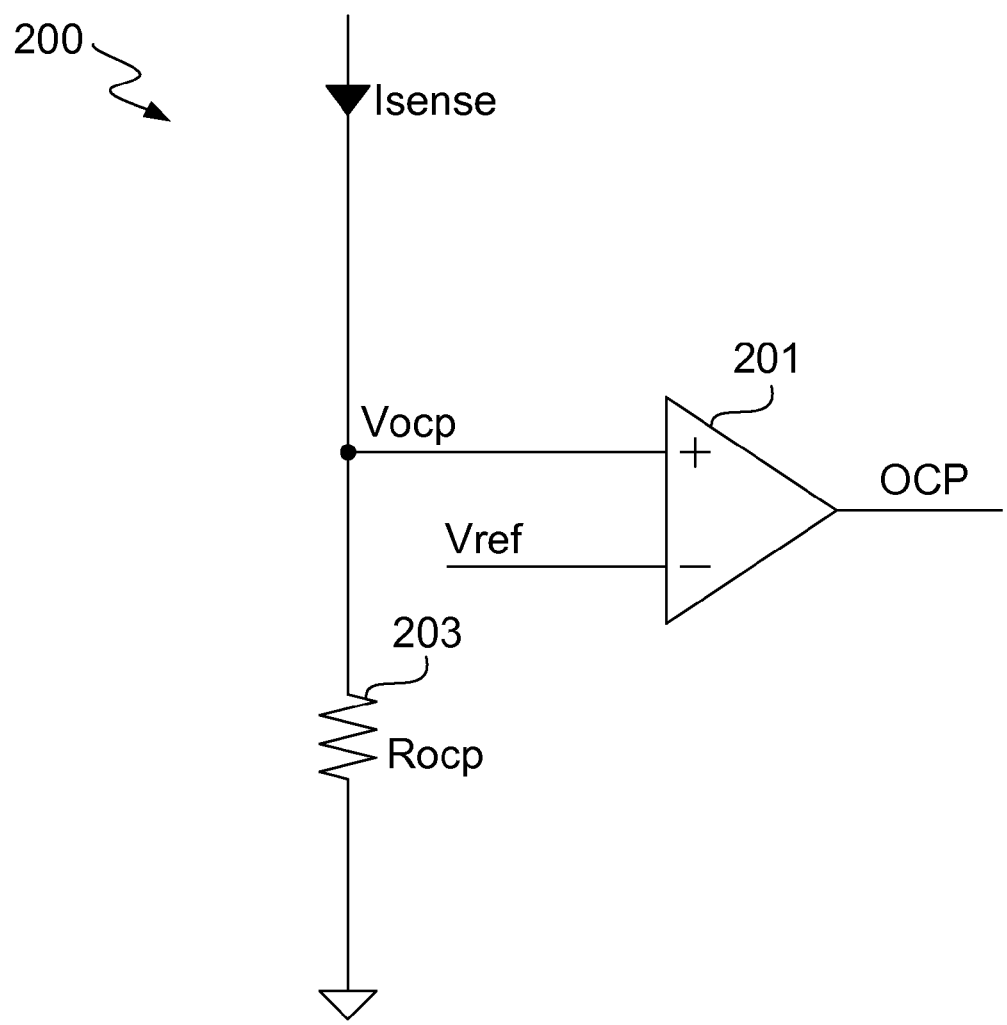
FIG. 2 is schematic diagram of an over current protection (OCP) circuit according to one embodiment of the present invention.

FIG. 2 illustrates a schematic diagram of an over current protection (OCP) circuit 200 according to one embodiment of the present invention. The OCP circuit 200 includes a comparator 201 and an OCP resistor 203. In one embodiment, the OCP circuit 200 can be used in a DC/DC converter. The OCP resistor 203 is coupled between the non-inverting terminal of the comparator 201 and ground.

In operation, the sensing current Isense flows through the OCP resistor 203. Accordingly, a voltage Vocp equal to Isense*Rocp is produced across the OCP resistor 203, where Rocp is a resistance of the OCP resistor 203. Furthermore, a reference voltage Vref with a substantially constant voltage level is provided to the inverting terminal of the comparator 201. In one embodiment, the reference voltage Vref can be 400 mv. The comparator 201 detects whether an over current condition occurs by comparing the voltage Vocp with the reference voltage Vref.

In one embodiment, the over current condition occurs if the voltage Vocp reaches the reference voltage Vref, that is $$Isense \times Rocp = Vref. \quad (3)$$

Substituting equation (2) to equation (3), a current limit $I_{LIM}$ of the load current $I_{load}$ which incurs the over current condition can be given by $$I_{LIM} = \frac{Vref \times Rg}{Rocp \times Rsense}. \quad (4)$$

The comparator 201 can output a signal OCP indicative of the over current condition if the load current $I_{load}$ reaches the current limit $I_{LIM}$. According to equation (4), the current limit $I_{LIM}$ is determined by the external components Vref, Rocp, Rg and Rsense. Due to the configurability of these external components, the current limit $I_{LIM}$ can be set or adjust to be compliant with various applications.

Figure 3:
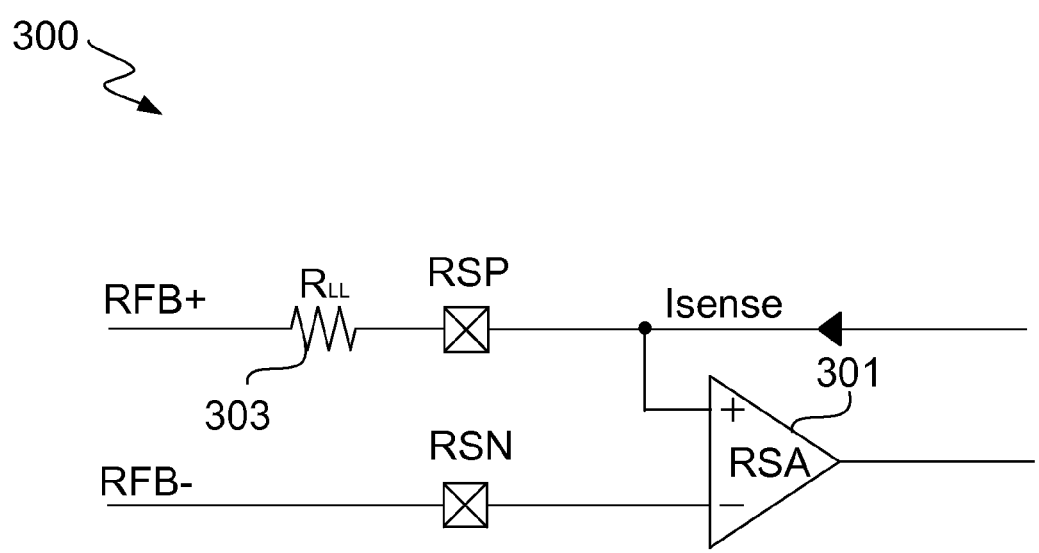
FIG. 3 is a schematic diagram of a load line control circuit according to one embodiment of the present invention.

FIG. 3 illustrates a schematic diagram of a load line control circuit 300 according to one embodiment of the present invention. The load line control circuit 300 includes a remote sense amplifier RSA 301 and an external resistor 303. In one embodiment, the load line control circuit 300 can be used in an electronic circuit to achieve relatively stable and accurate output impedance.

In one embodiment, the electronic circuit can be a DC/DC converter. In the example of FIG. 2, lines RFB+ and RFB− are coupled to the electronic circuit using the Kelvin connection to receive a feedback signal which represents a load voltage of the electrical circuit. The line RFB+ is further coupled to the non-inverting terminal of the remote sense amplifier RSA 301 through the external resistor 303. The line RFB− is coupled to the inverting terminal of the remote sense amplifier RSA 301. The sensing current Isense indicative of the load current of the electrical circuit is injected to the load line control circuit 300 via a RSP pin. In one embodiment, the remote sense amplifier RSA 301 can be integrated into an IC and interfaces with external components via the RSP pin and RSN pin. The output of the remote sense amplifier RSA 301 can be compared to a reference signal, e.g., to control power delivered to the load. The power delivered to the load can be limited or adjusted continuously or in steps.

In operation, a substantially constant voltage difference between pins RSP and RSN can be achieved by a voltage positioning function inherent with the load line control circuit 300. In this instance, if the load current changes, the voltage variation of the feedback signal (the load voltage) can be offset by the voltage variation across the external resistor 303. Accordingly, the output resistance of the DC/DC converter can be given by $$R_{loadline} = \frac{\Delta V_{load}}{\Delta I_{load}} = R_{LL} \times Rsense / Rg, \quad (5)$$

where $R_{loadline}$ is the output resistance and $R_{LL}$ is the resistance of the external resistor 303. According to equation (5), the output resistance $R_{loadline}$ is determined by the external resistors, resulting in a relatively accurate and stable value of $R_{loadline}$. Furthermore, if the load current increases, the sensing current Isense increases according to equation (2) and the voltage across the external resistor 303 will increase with the increased sensing current Isense. Accordingly, the output of the remote sense amplifier RSA 301 can decrease the load voltage to maintain the constant voltage difference between the pins RSP and RSN. As a result, power delivered to the load of the electronic circuit is controlled. Furthermore, the load can consume less power compared with the situation where the load current is increased while the load voltage keeps the same. Therefore, the power efficiency of the electrical circuit can be enhanced.

Figure 4:
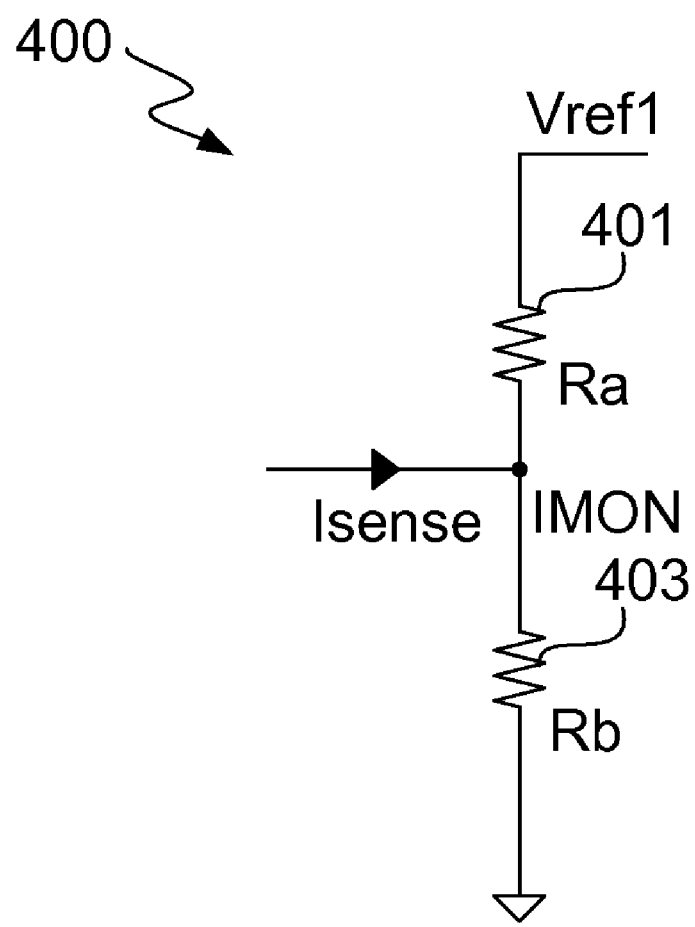
FIG. 4 a schematic diagram of a current monitor circuit according to one embodiment of the present invention.

FIG. 4 illustrates a schematic diagram of a current monitor circuit 400 according to one embodiment of the present invention. The current monitor circuit 400 includes an external resistor 401 and an external resistor 403 coupled in series between a reference voltage source Vref1 and ground. In one embodiment, the current monitor circuit 400 is used in a DC/DC converter to provide a voltage $V_{IMON}$ indicative of the load current at the IMON node. The voltage $V_{IMON}$ can be given by $$V_{IMON} = Vref1 \times \frac{Rb}{Ra+Rb} + I_{load} \times \frac{Rsense}{Rg} \times \frac{RaRb}{Ra+Rb}, \quad 6)$$

where Ra is a resistance of the external resistor 401 and Rb is a resistance of the external resistor 403.

Figure 5:
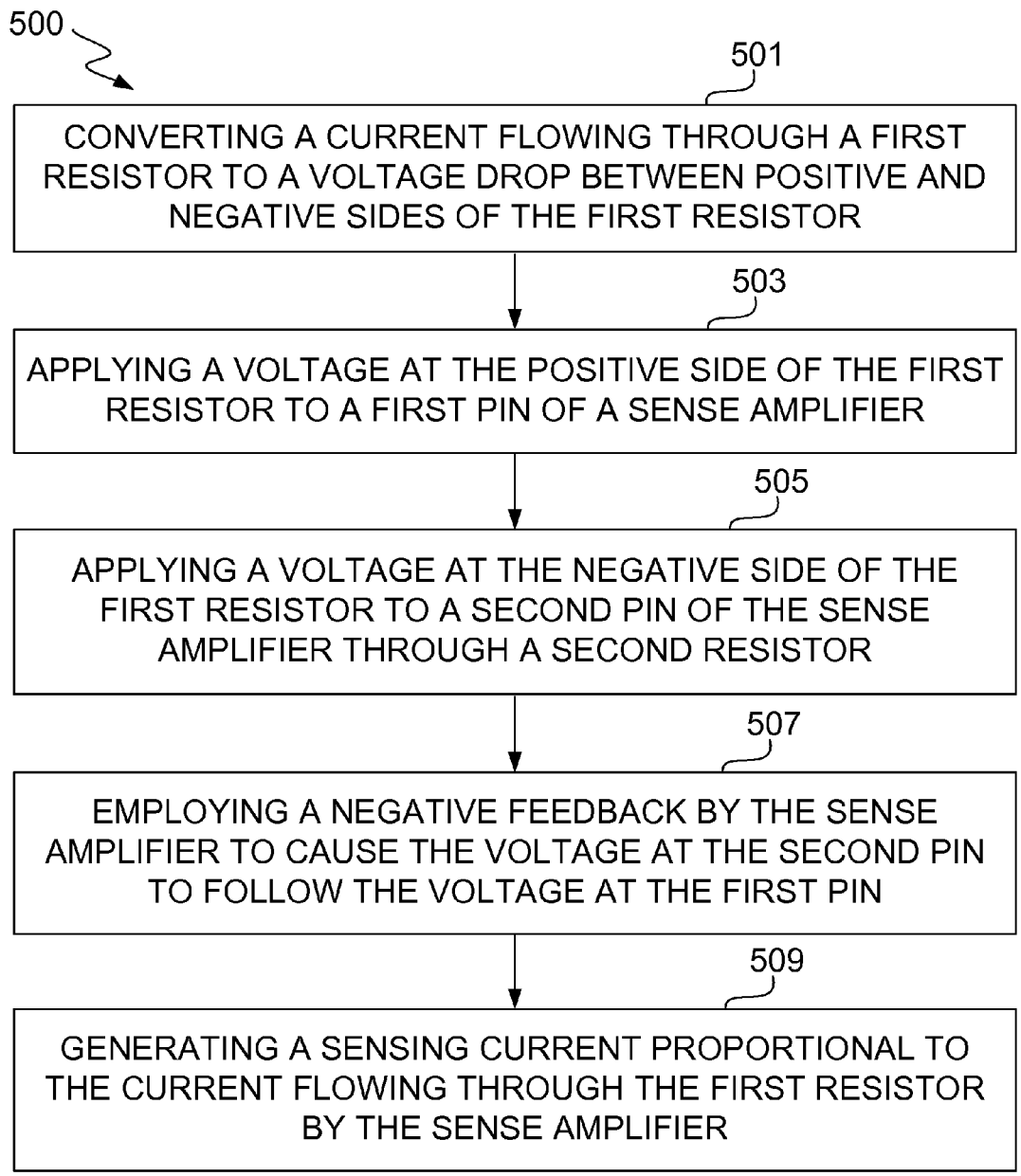
FIG. 5 is a flow chart of a method for current sensing according to one embodiment of the present invention.

FIG. 5 illustrates a flow chart 500 of a method for current sensing according to one embodiment of the present invention. Although specific steps are disclosed in FIG. 5, such steps are exemplary. That is, the present invention is well suited to performing various other steps or variations of the steps recited in FIG. 5. FIG. 5 is described in combination with FIG. 1.

In block 501, a current flowing through a first resistor is converted to a voltage drop between positive and negative sides of the first resistor, in one embodiment, the inductor current $I_L$ flowing through the sense resistor 109 is converted to the voltage drop Vsense between positive and negative sides of the sense resistor 109.

In block 503, the voltage at the positive side of the first resistor is applied to a first pin of a sense amplifier. In one embodiment, the voltage at the positive side of the sense resistor 109 is applied to the CSP pin of the sense amplifier 120, which includes the amplifier 103, the transistor 105 and the current mirror 101.

In block 505, the voltage at the negative side of the first resistor is applied to a second pin of the sense amplifier through a second resistor. In one embodiment, the voltage at the negative side of the sense resistor 109 is applied to the CSN pin of the sense amplifier 120 through the external resistor 107.

In block 507, the sense amplifier employs a negative feedback to cause the voltage at the second pin to follow the voltage at the first pin. In one embodiment, the transistor 105 is coupled to the amplifier 103 to form a negative feedback circuit, such that the amplifier 103 becomes a voltage follower to cause the voltage at the CSN pin to follow the voltage at the CSP pin.

In block 509, a sensing current proportional to the current flowing through the first resistor is generated by the sense amplifier. In one embodiment, the current mirror 101 included in the sense amplifier generates the current equal to $I_L$*Rsense/Rg to flow from the transistor 105 to the external resistor 107. Due to the inherent duplication function of the current mirror 101, the sensing current flowing through the output line 113 of the current mirror 101 is also equal to $I_L$*Rsense/Rg, which is proportional to the current $I_L$ flowing through the sense resistor 109.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. A circuit comprising:
 a first resistor for converting a current flowing through said first resistor to a voltage drop between positive and negative sides of said first resistor;
 a second resistor coupled to said negative side of said first resistor; and
 a sense amplifier coupled to said positive side of said first resistor via a first pin of said sense amplifier and coupled to said negative side of said first resistor through said second resistor via a second pin of said sense amplifier, and for employing a negative feedback to generate a sensing current proportional to said current flowing through said first resistor,
 wherein said sense amplifier further comprises:
   a voltage follower coupled to said first and second pins via non-inverting and inverting terminals of said voltage follower respectively to cause a voltage at said second pin to follow a voltage at said first pin; and
   a current mirror coupled to said voltage follower to provide said sensing current proportional to said current flowing through said first resistor.

2. The circuit of claim 1, wherein a ratio between said sensing current and said current flowing through said first resistor is determined by resistances of said first and second resistors.

3. The circuit of claim 1, further comprising:
 a third resistor for converting said sensing current to an input voltage;
 a comparator coupled to said third resistor for generating a signal indicative of an over current condition by comparing said input voltage with a reference voltage.

4. The circuit of claim 3, wherein a limit current incurring said over current condition is determined by said reference voltage and resistances of said first, second and third resistors.

5. The circuit of claim 1, further comprising:
 a third resistor for converting said sensing current to a voltage across said third resistor, wherein said sensing current indicates a load current of an electronic circuit; and
 a remote sense amplifier coupled to said electronic circuit through said third resistor for stabilizing an output impedance of said electronic circuit based on said voltage across said third resistor.

6. The circuit of claim 5, wherein a variation in said voltage across said third resistor offsets a variation in a load voltage of said electronic circuit to stabilize said output impedance.

7. The circuit of claim 5, wherein said output impedance is determined by resistances of said first, second and third resistors.

8. The circuit of claim 5, wherein said electronic circuit comprises a DC/DC converter.

9. The circuit of claim 5, wherein a load voltage of said electrical circuit decreases in accordance with an increase in said voltage across said third resistor if said load current increases.

10. The circuit of claim 1, further comprising:
 third and fourth resistors coupled in series between a reference voltage source and ground; and
 a monitor node coupled to a conjunction node of said third and fourth resistors for receiving said sensing current and for providing a voltage at said monitor node indicative of a current at said monitor node.

11. A method comprising:
 converting a current flowing through a first resistor to a voltage drop between positive and negative sides of said first resistor;
 applying a voltage at said positive side of said first resistor to a first pin of a sense amplifier;
 applying a voltage at said negative side of said first resistor to a second pin of said sense amplifier through a second resistor;
 employing a negative feedback by said sense amplifier to cause said voltage at said second pin to follow said voltage at said first pin;
 generating a sensing current proportional to said current flowing through said first resistor by said sense amplifier;
 converting said sensing current to an input voltage; and
 comparing said input voltage with a reference voltage to generate a signal indicative of an over current condition.

12. A method comprising:
 converting a current flowing through a first resistor to a voltage drop between positive and negative sides of said first resistor;

applying a voltage at said positive side of said first resistor to a first pin of a sense amplifier;

applying a voltage at said negative side of said first resistor to a second pin of said sense amplifier through a second resistor;

employing a negative feedback by said sense amplifier to cause said voltage at said second pin to follow said voltage at said first pin;

generating a sensing current proportional to said current flowing through said first resistor by said sense amplifier;

converting said sensing current to a voltage across a third resistor, wherein said sensing current indicates a load current of an electronic circuit; and offsetting a variation in a load voltage of said electronic circuit by a variation in said voltage across said third resistor to stabilize an output impedance of said electronic circuit.

13. A system comprising:
a DC/DC converter for providing a load current to a load;
a first resistor coupled to said DC/DC converter for sensing said load current;
a second resistor coupled to said first resistor; and
a sense amplifier coupled to a positive side of said first resistor directly via a first pin of said sense amplifier and to a negative side of said first resistor through said second resistor via a second pin of said sense amplifier, said sense amplifier employing a negative feedback to generate a sensing current proportional to said load current, wherein said sense amplifier further comprises:
   a voltage follower coupled to said first and second pins via non-inverting and inverting terminals of said voltage follower respectively to cause a voltage at said second pin to follow a voltage at said first pin; and
   a current mirror coupled to said voltage follower to provide said sensing current proportional to said current flowing through said first resistor.

14. The system of claim 13, further comprising:
an over current protection circuit for receiving said sensing current and for protecting said DC/DC converter from an over current condition based on said sensing current.

15. The system of claim 13, further comprising:
an output line control circuit for receiving said sensing current and for stabilizing an output impedance of said DC/DC converter based on said sensing current.

16. The system of claim 13, further comprising:
a current monitor circuit for receiving said sensing current and for monitoring a current at a monitor node of said DC/DC converter based on said sensing current.

* * * * *